United States Patent [19]

Addis et al.

[11] Patent Number: 5,075,636
[45] Date of Patent: Dec. 24, 1991

[54] DIFFERENTIAL AMPLIFIER WITH FAST OVERDRIVE RECOVERY

[75] Inventors: John L. Addis, Beaverton; Davorin Fundak, Aloha; Frank G. DiGiovanni, Portland, all of Oreg.

[73] Assignee: Tektronix, Inc., Beaverton, Oreg.

[21] Appl. No.: 620,792

[22] Filed: Dec. 3, 1990

[51] Int. Cl.⁵ .............................................. H03F 3/45
[52] U.S. Cl. .................................... 330/260; 330/261
[58] Field of Search ............... 330/252, 260, 261, 293, 330/295, 296, 298

[56] References Cited

U.S. PATENT DOCUMENTS

| | | | |
|---|---|---|---|
| 4,528,515 | 7/1985 | Gross | 330/261 X |
| 4,691,174 | 9/1987 | Nelson et al. | 330/260 |
| 4,714,896 | 12/1987 | Addis | 330/261 |

*Primary Examiner*—Steven Mottola
*Attorney, Agent, or Firm*—Peter J. Meza; Francis I. Gray

[57] ABSTRACT

A differential amplifier includes two amplifier halves each including a feedback transistor for providing closed-loop gain, for driving a common load impedance, and for providing a differential current output. Each amplifier half further includes a first feedback path operable in a normal operating condition and a second feedback path operable in an overdrive condition. The first feedback path consists of first and second diodes connected between an emitter of the feedback transistor and a voltage input of the differential amplifier. A junction between the first and second diodes is coupled to the common load impedance. The second feedback path consists of a third diode connected between the emitter of the feedback transistor and the second voltage input, such that the differential amplifier and the feedback transistor remain operational and electrically isolated from the load impedance during the overdrive condition. Once the overdrive condition is removed, the first feedback path again becomes operational, and the amplifier quickly recovers without saturation or thermally induced errors. A minimum number of circuit elements is required for overdrive recovery including three diodes and a current source for biasing the third diode in the overdrive condition.

15 Claims, 8 Drawing Sheets

DIFFERENTIAL AMPLIFIER WITH FAST OVERDRIVE RECOVERY

BACKGROUND OF THE INVENTION

The present invention relates to differential and operational amplifiers in general, and more specifically to those amplifiers capable of recovering quickly and without thermally generated distortion from an overdrive condition.

Differential and operational amplifiers typically have a normal dynamic operating range in which a predetermined transfer function of the amplifier is substantially linear. For input voltage swings beyond this range, the amplifier is "overdriven" into a nonlinear region outside of the normal operating range in which active circuit elements can be saturated or cut off. In addition, the overdrive condition can produce a pattern of power dissipation and thermal heating in the active circuit elements that is different from that of the normal linear region.

Consequently, recovery from the nonlinear overdrive condition to the normal operating condition can be delayed by the time needed for saturated active circuit elements to return to a normal operating mode. The recovery can also be delayed, and over a much greater period of time, by the time necessary to restore normal thermal equilibrium and remove thermally induced errors.

Prior art amplifiers capable of recovering from an overdrive condition have included complicated clamping circuits or Darlington feedback transistors that increase the parts count of the circuit.

For example, U.S. Pat. No. 4,691,174 ('174) to Nelson et al entitled "Fast Recovery Amplifier" shows a differential amplifier including identical amplifier halves. In FIG. 5 of the '174 patent, each amplifier has a first feedback path operable in a normal mode including two sets of Darlington transistors (Q5, Q7; Q6, Q8), two diodes (D1, D3; D2, D4), two resistors (R1, R3; R2, R4), and a current source (25). Each amplifier further includes a second feedback path operable in an overdrive condition including a Darlington transistor (Q7; Q8), a diode (D3; D4), two resistors (R1, R3; R2, R4), and a current source (25).

In another example, U.S. Pat. No. 4,714,896 ('896) to Addis entitled "Precision Differential Amplifier having Fast Overdrive Recovery" shows a differential amplifier including identical amplifier halves. In FIG. 2 of the '896 patent, each amplifier has a first feedback path operable in a normal mode that includes a Darlington transistor (Q3 and Q4) and two diodes (D1 and D2). In FIG. 3 of the '896 patent, each amplifier further includes a second feedback path operable in an overdrive condition that includes the first transistor in the Darlington pair (Q3), two different diodes (D3 and D4), and biasing means for diodes D3 and D4 including two current sources (20, 22; 30, 32).

What is desired is an amplifier circuit capable of recovering quickly and without thermally generated distortion from an overdrive condition having a minimum parts count that is less than the parts count of prior art amplifiers.

SUMMARY OF THE INVENTION

In accordance with the present invention, a differential amplifier includes two amplifier halves each including a feedback transistor for providing closed-loop gain, for driving a common load impedance, and for providing a differential current output. Each amplifier half further includes a first feedback path operable in a normal operating condition and a second feedback path operable in an overdrive condition. The first feedback path consists of first and second diodes connected between an emitter of the feedback transistor and a voltage input of the amplifier. A junction between the first and second diodes is coupled to the common load impedance. The second feedback path consists of a third diode connected between the emitter of the feedback transistor and the voltage input, such that the differential amplifier and the feedback transistor remain operational and electrically isolated from the load impedance during the overdrive condition. Once the overdrive condition is removed, the first feedback path again becomes operational, and the amplifier quickly recovers without saturation or thermally induced errors. Thus, the minimum number of parts required for overdrive recovery includes three diodes and a means for biasing the third diode in the overdrive condition such as a current source.

It is therefore one object of the present invention to provide a precision differential amplifier that quickly recovers from an overdrive condition to a linear operating range without saturation or thermally induced errors.

It is another object of the present invention to provide a differential amplifier with an overdrive recovery circuit having fewer components than is possible with prior art overdrive recovery circuits.

It is another object of the present invention to provide a differential amplifier with an overdrive recovery circuit that can easily be fabricated as an integrated circuit or out of discrete components.

It is another object of the present invention to provide a differential amplifier with an overdrive recovery circuit that can also provide a precise, linear current output in response to a voltage input.

Other objects, features, and advantages of the present invention are obvious to those skilled in the art upon a reading of the following detailed description of the invention taken in conjunction with the accompanying drawing figures.

DETAILED DESCRIPTION OF THE INVENTION

Figure 1:
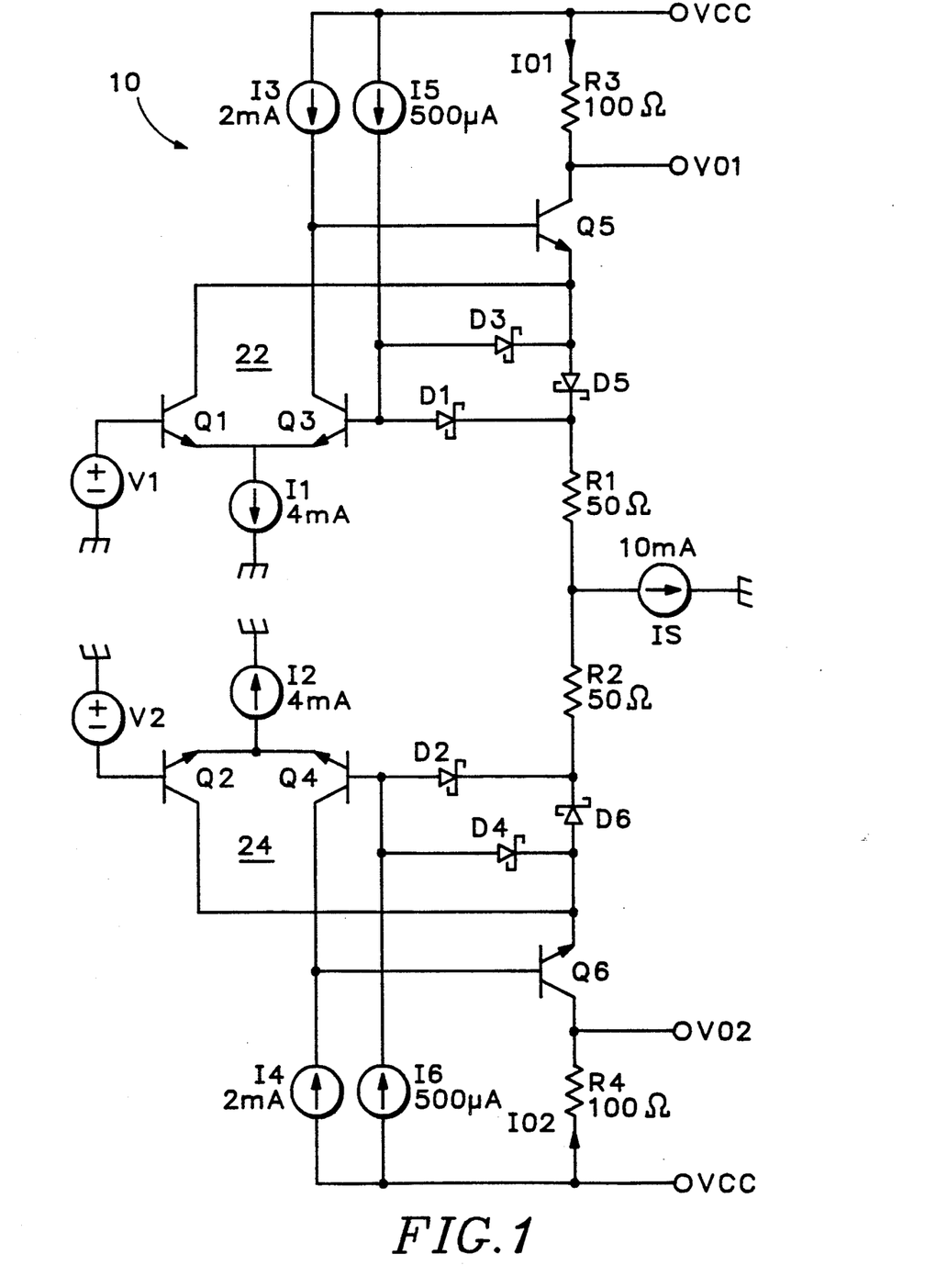
FIG. 1 is a schematic diagram of a first embodiment of a differential amplifier including two amplifier halves each incorporating the overdrive recovery circuit of the present invention.

A differential amplifier 10 is illustrated in FIG. 1 having two identical amplifier halves 22 and 24. Circuit descriptions of one buffer half apply equally to corresponding circuit components in the other buffer half, whether or not such components are specifically recited. Amplifier half 22 includes a differential pair of transistors Q1 and Q3, the base of transistor Q1 being coupled to a single-ended input voltage V1. As is known in the art the bases of transistors Q1 and Q3 form positive and negative inputs, and the collectors of transistors Q1 and Q3 form negative and positive outputs. The differential pair of transistors Q1, Q3 are biased by a tail current source I1 coupled to the emitters of transistors Q1 and Q3, and a load current source I3 coupled to the collector of transistor Q3. Current source I1 has a typical value of 4 mA and current source I3 has a typical value of 2 mA. A single feedback transistor Q5 has a base connected to the collector of transistor Q3, an emitter connected to the collector of transistor Q1, and a collector for providing a single-ended current output, IO1. A load impedance such as resistor R3 converts the single-ended current IO1 to a single-ended voltage VO1. Feedback transistor Q5 is also used to provide a closed-loop gain from the collector of transistor Q3 to the base of transistor Q3 such that the voltages at the base of transistors Q1 and Q3 are substantially equal. In addition, feedback transistor Q5 is used to drive resistor R1. Amplifier 22 is configured to have a gain of two, and therefore typical values for load resistors R1 and R3 are 50 ohms and 100 ohms, respectively.

A first feedback path consists of diodes D1 and D5 that are biased on in the normal condition and are connected between the emitter of the feedback transistor Q5 and the base of transistor Q3. The junction of the cathodes of diodes D1 and D5 is coupled to resistor R1. A second feedback path consists of diode D3 that is biased on in an overdrive condition connected between the emitter of the feedback transistor Q5 and the base of transistor Q3. Diode D3 is biased on during the overdrive condition by current source I5 that is coupled to the anode of diode D3. The value of current source I5 is typically set to a low value such as 500 μA.

Similarly, FIG. 1 also shows a second amplifier half 24 that includes a differential pair of transistors Q2 and Q4, the base of transistor Q2 being coupled to a single-ended input voltage V2. The bases of transistors Q2 and Q4 form positive and negative inputs, and the collectors of transistors Q2 and Q4 form negative and positive outputs. A tail current source I2 and a load current source I4 provide bias current for the differential pair of transistors Q2, Q4. A single feedback transistor Q6 has a base connected to the collector of transistor Q4, an emitter connected to the collector of transistor Q2, and a collector for providing a single-ended current output, IO2. A load resistor R4 converts the single-ended current IO2 to a single-ended voltage VO2. Feedback transistor Q6 drives resistor R2.

A first feedback path consists of diodes D2 and D6 that are biased on in the normal condition and are connected between the emitter of the feedback transistor Q6 and the base of transistor Q4. The junction of the cathodes of diodes D2 and D6 is coupled to the resistor R2. A second feedback path consists of diode D4 that is biased on in the overdrive condition connected between the emitter of the feedback transistor Q6 and the base of transistor Q4. Diode D4 is biased on during the overdrive condition by current source I6 that is coupled to the anode of diode D4.

The amplifier halves 22 and 24 are coupled together at the cathodes of diodes D1 and D5 and at the cathodes of diodes D2 and D6 through resistors R1, R2 and current source IS. Coupling the two amplifier halves 22 and 24 together in the manner described forms a differential amplifier 10 wherein the single-ended input voltages V1 and V2 form a differential input voltage V1, V2, and the single-ended output voltage VO1 and VO2 form a differential output voltage VO1, VO2. The load current IS is directed through load resistors R1 and R2 and through the output load resistors R3 and R4 according to the magnitude and polarity of the differential voltage V1, V2.

In normal operation, a differential input signal V1, V2 appearing at the bases of transistors Q1 and Q2 is replicated at the cathodes of diodes D5 and D6, respectively, by the closed-loop feedback provided by feedback transistors Q5 and Q6. Small signal input signals cause current IS to flow through resistors R1 and R2 that is substantially reproduced at the collectors of feedback transistors Q5 and Q6. Thus, a differential output current IO1, IO2 is produced at the collectors of Q5 and Q6 that can be transformed into a differential output voltage VO1, VO2 by output load resistors R3 and R4.

In differential amplifier half 22 of FIG. 1, diodes D1 and D5 can be silicon diodes or Schottky diodes. However, it is desirable that diode D3 be a Schottky diode to prevent transistor Q1 from saturating during the overdrive condition.

Figure 2:
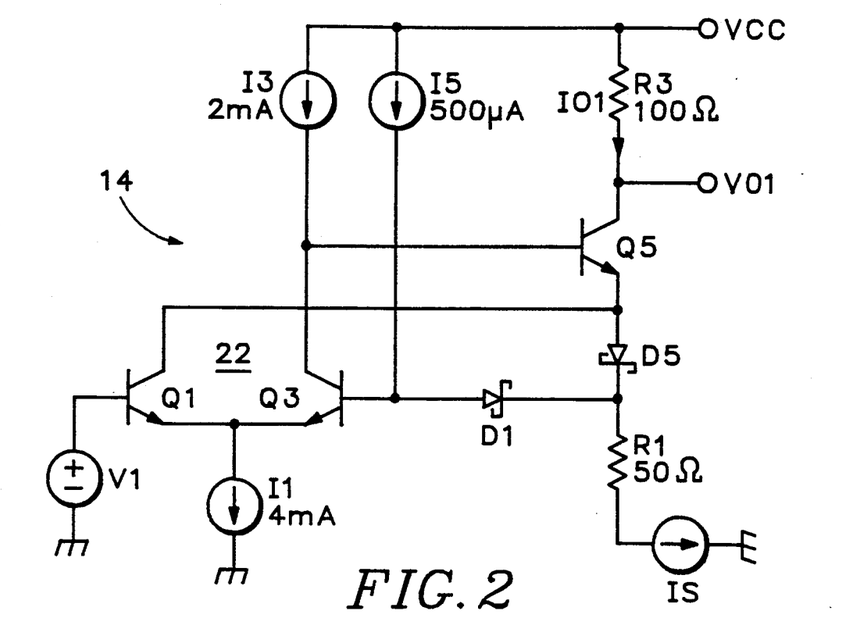
FIG. 2 is a partial schematic diagram of an amplifier half of FIG. 1 wherein the first feedback path is conducting to provide normal linear operation.

For a greater understanding of the normal operating mode, a partial schematic of one amplifier half 22 is shown in FIG. 2. Only the circuit elements that are biased on appear in the schematic. Thus, the normal operating mode feedback path from the emitter of feedback transistor Q5 is shown that consists of diodes D1 and D5. The junction of the cathodes of diodes D1 and D5 is coupled to the resistor R1. Note that the current provided by current source I5 is constant. Therefore, current source I5 does not generate any signal dependent differential current or voltage.

Figure 3:
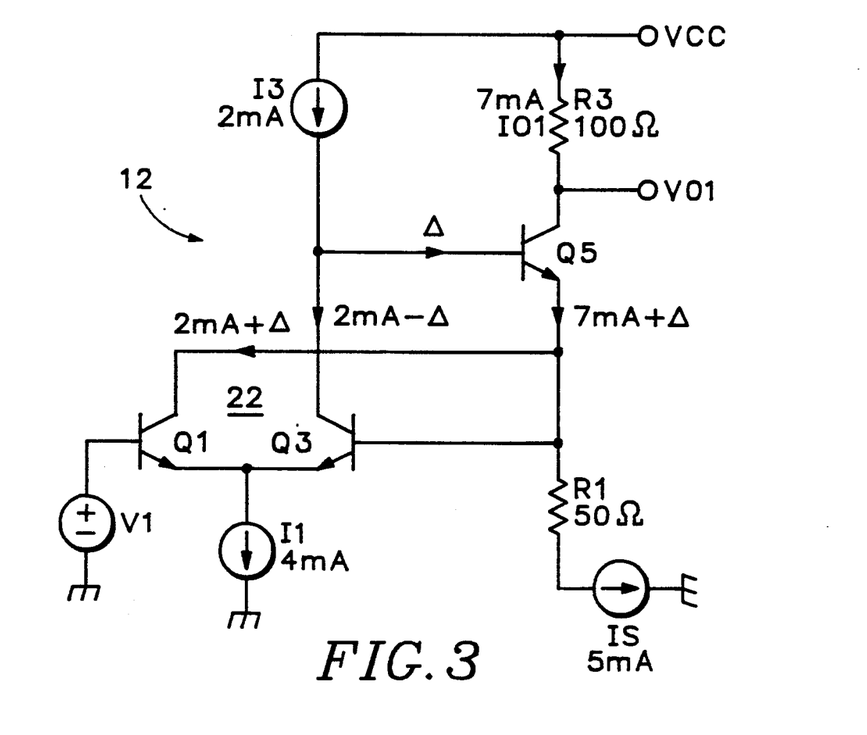
FIG. 3 is a partial schematic diagram of an amplifier half of FIG. 1 illustrating the accurate current output characteristics of the amplifier.

The current outputs IO1 and IO2 at the collectors of transistors Q5 and Q6 are compensated for losses due to transistor Q5 beta and therefore accuracy and linearity of the amplifier are improved. FIG. 3 shows a partial schematic of amplifier half 22 wherein the first and second feedback paths have been replaced with a short circuit and current source I5 has been removed for the purpose of analyzing the transistor Q5 beta compensation mechanism. If the input voltage V1 is assumed to be zero, and I1=4 mA, I3=2 mA, IS=5 mA, then IO1=7 mA, without any beta errors. Errors due to transistor Q5 beta appear as transistor Q5 base current, designated Δ. This current error cannot be supplied by current sources I1 or I3 since the value of these current sources is fixed. Current supplied at the bases of transistors Q1 and Q3 is negligible and can be ignored for purposes of this analysis. Thus, the current error Δ must be subtracted from the collector current of transistor Q3 and is therefore added to the collector current of transistor Q1. Since the collector of transistor Q1 is connected directly to 25 the emitter of transistor Q5, the error current Δ lost at the base of transistor Q5 is supplied to the emitter, and the remaining collector current is free from beta errors.

Referring back to FIG. 1, in an overdrive condition a large input signal V1, V2 is presented at the bases of transistors Q1 and Q2. The more positive of the two single-ended voltage inputs, V1 or V2, causes the current provided by current source IS to be directed to the corresponding amplifier half 22 or 24. Consequently current is diverted from diodes D5 or D6. Diode D5 is completely cutoff when the single-ended voltage V1 is less than the single-ended voltage V2 by a voltage equal to IS×R2. Thus, a large negative voltage on the base of transistor Q1 causes the overdrive condition. Similarly, diode D6 is completely cutoff when the single-ended voltage V1 is greater than the single-ended voltage V2 by a voltage equal to IS×R1.

Assuming that amplifier half 22 is overdriven and diode D5 is cutoff, the base of Q1 equals the negative-going single-ended voltage V1. Correspondingly, the emitter of transistor Q5 is pulled negative by the collector current of transistor Q1. Since the feedback loop through diodes D1 and D5 is open, the emitter of transistor Q5 drops rapidly by approximately 0.3 volts until diode D3 conducts. When diode D3 is biased on, a new feedback loop is established between the emitter of feedback transistor Q5 to the base of transistor Q3. The source of bias current for diode D3 is provided by current source I5 and the return path for this current is provided by the collector of transistor Q1. The new feedback loop electrically isolates the amplifier half 22 from the resistor R1 and therefore the amplifier half 22 remains operative for all further negative voltages applied to the base of Q1. Thus, transistors Q1, Q3, and Q5 are all biased to a defined operating mode wherein none of the transistors are cutoff or saturated.

Figure 4:
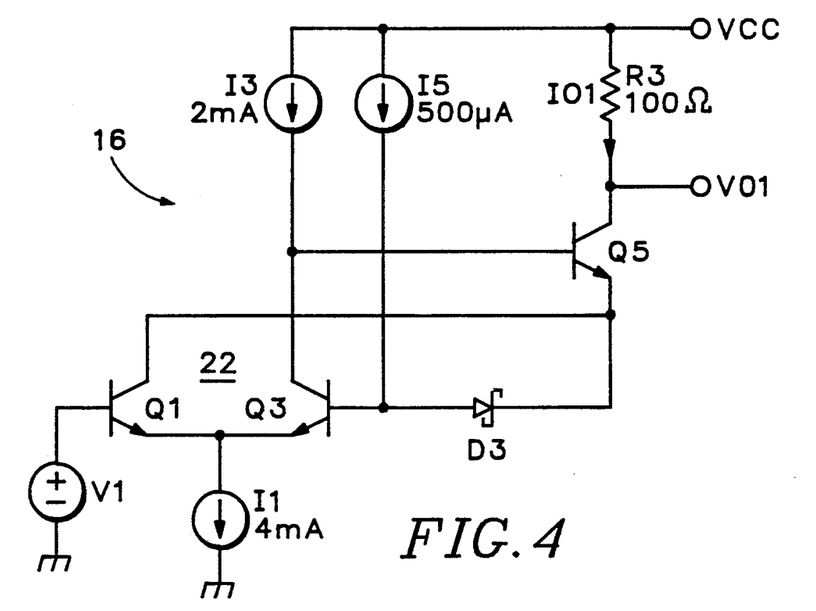
FIG. 4 is a partial schematic diagram of an amplifier half of FIG. 1 wherein the second path is conducting to electrically isolate the amplifier from an overdrive condition.

For a greater understanding of circuit operation in the overdrive condition, a partial schematic of one amplifier half 22 is shown in FIG. 4. Only the circuit elements that are biased on appear in the schematic. Thus, the overdrive feedback path from the emitter of feedback transistor Q5 is shown that consists of diode D3. The amplifier half 22 is isolated from resistor R1, and therefore R1 does not appear in this schematic. Note that the current provided by current source I5 now flows through diode D3 to the collector of transistor Q1.

The operating points of transistors Q1 and Q3 are little changed by extreme negative input voltages and are therefore not susceptible to changes in power dissipation that cause thermal distortion upon recovery from the overdrive condition. Note that the collector-to-emitter voltages of transistors Q1 and Q3 are effectively clamped by the action of diode D3, and that the tail bias current I1 flows approximately equally through the transistors.

Figure 5:
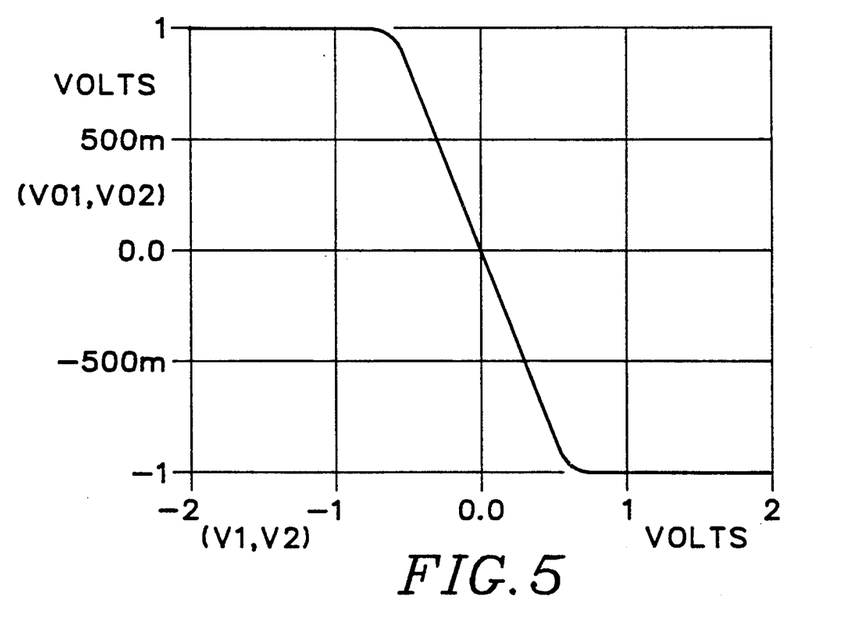
FIG. 5 is a graph of the linear transfer function of the amplifier according to the present invention.
Figure 6:
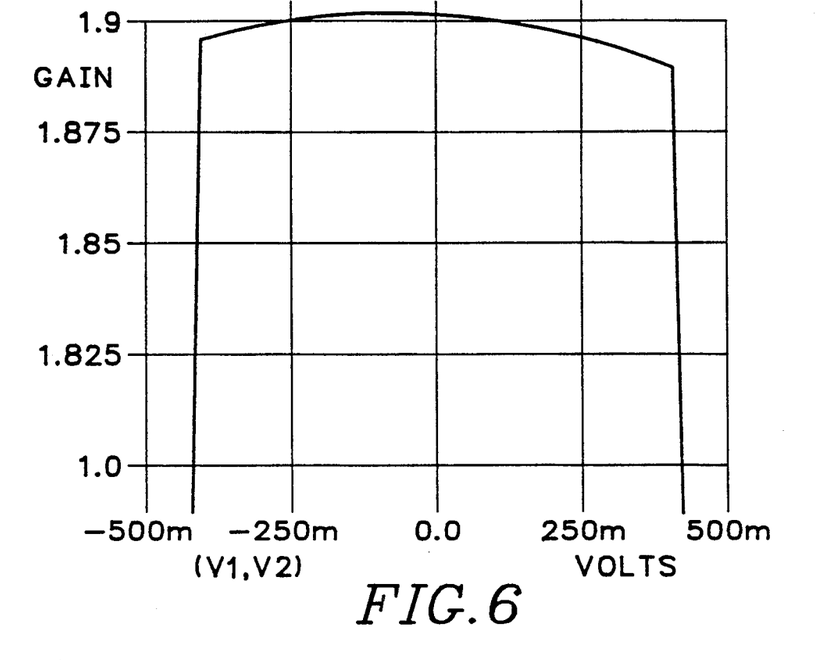
FIG. 6 is a graph that is the derivative of the linear transfer function of FIG. 5.
Figure 7:
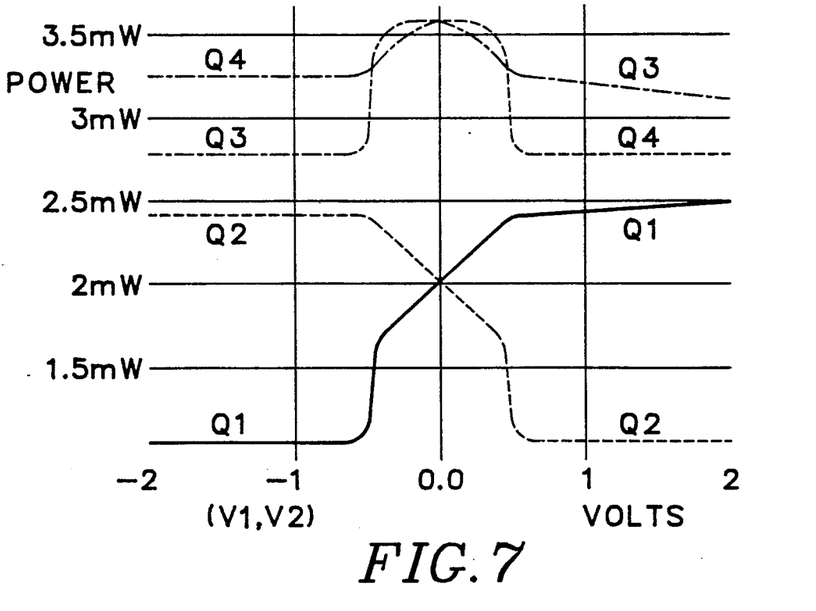
FIG. 7 is a graph of the power dissipation of the input amplifiers of the amplifier according to the present invention.
Figure 8:
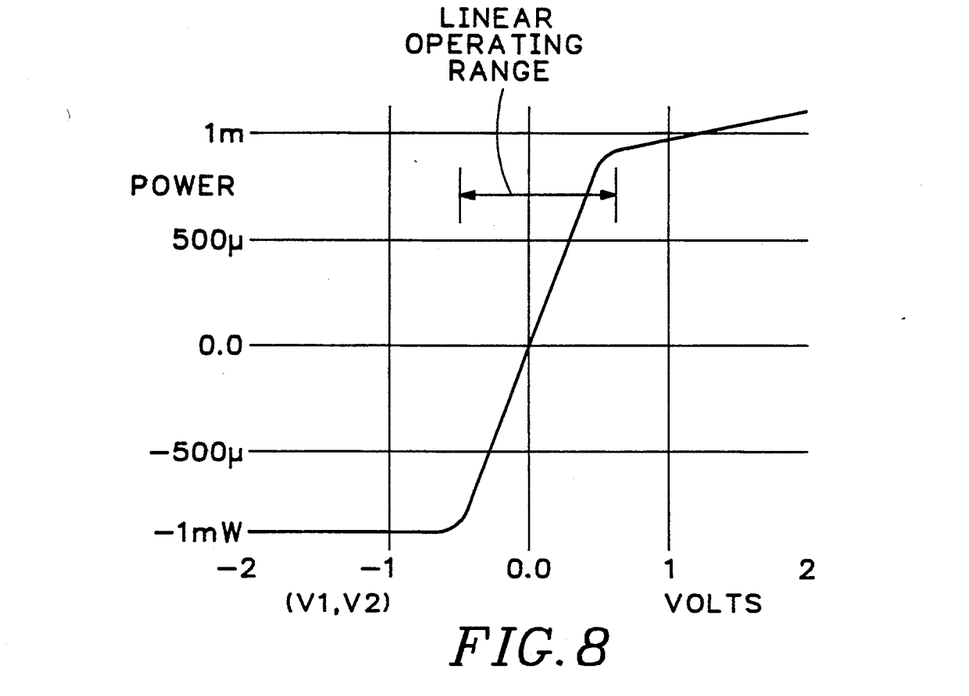
FIG. 8 is a graph of the net power dissipation of the input amplifiers of FIG. 7.

The graphs shown in FIGS. 5-8 help to illustrate the desirable thermal characteristics of the overdrive recovery circuit of the present invention. FIG. 5 illustrates the linear transfer function of the amplifier 10 wherein the gain is set to two in the linear region. FIG. 6 is the derivative of the transfer function of FIG. 5 and thus shows small signal gain as a function of the differential input voltage. Note that the gain in the linear region is substantially constant. FIG. 7 shows the power dissipation of the four transistors Q1-Q4. For minimum thermal distortion, it is desirable that the sum of the power dissipation of transistors Q1 and Q4 minus the power dissipation of transistors Q2 and Q3 be equal to a constant power in the overdrive condition. It is further desirable that this constant power be equal to the same power as in the linear region as the amplifier 10 approaches the overdrive condition. Thus, FIG. 8 shows the algebraic sum of the net power dissipation of transistors (Q1+Q3)−(Q2+Q4). Note that the net power dissipation is substantially constant in the overdrive condition and equal to the net power dissipation at the edge of the linear region.

In a typical semiconductor process, a transistor with a thermal resistance of 100° C./Watt and a base-to-emitter voltage temperature coefficient of −1.6 mV/°C. generates a thermal distortion voltage of 160 $\mu$V/mW of power dissipation change. As shown in FIG. 8, the change in power dissipation in the overdrive condition is about 0.1 mW over one volt of input signal. Therefore the total thermally generated distortion is approximately equal to 0.1 mW × 160 $\mu$V/mW = 16 $\mu$V for one volt of input signal, or 0.0016% distortion. The thermally generated distortion is even less for large negative input signals. To minimize thermal distortion to the greatest degree possible, it is desirable to fabricate amplifier 10 as an integrated circuit wherein transistors Q1-Q4 are matched and are in close proximity.

Figure 9:
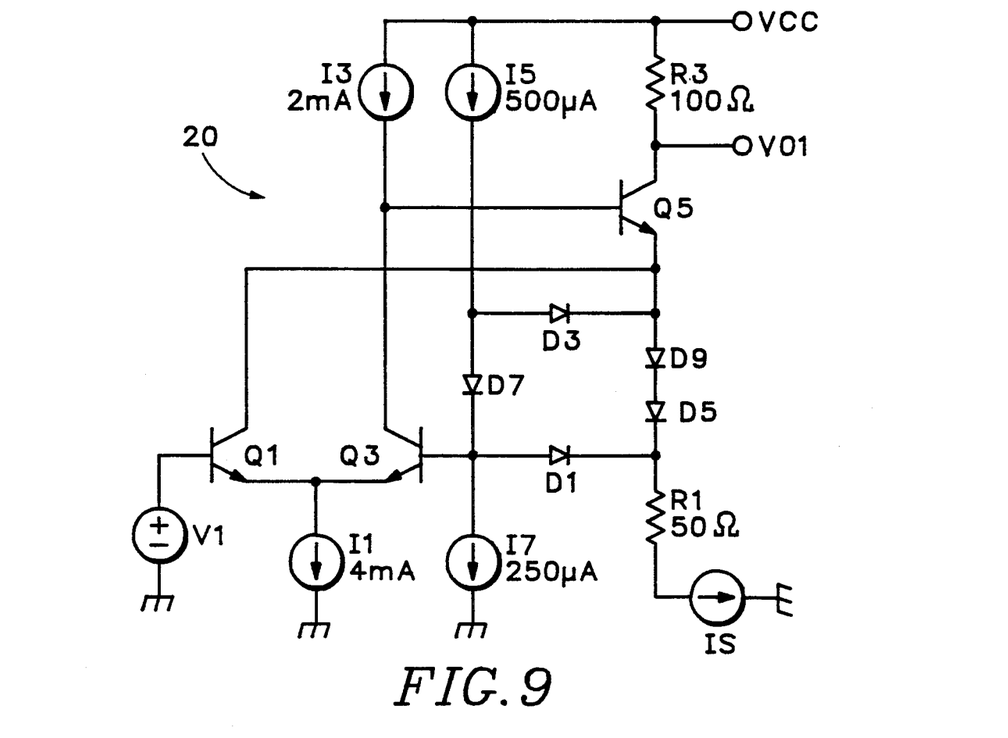
FIGS. 9, 9A, 10 and 11 are schematic diagrams of alternative embodiments of the overdrive recovery circuit of the present invention.

An alternative embodiment of amplifier 20 suitable for use as a differential amplifier is shown in FIG. 9. One amplifier half is shown including a differential pair of transistors Q1, Q3, biasing current sources I1 and I3, and a single feedback transistor Q5 as in the first embodiment. The configuration and operation of amplifier 20 is the same as that of amplifier halves 22 or 24 in FIG. 1, with the exception that the first and second feedback paths are configured so that more voltage is applied to the collector of transistor Q1. If desired, FIG. 9 illustrates that silicon diodes can be used instead of Schottky diodes.

Thus, a first feedback path consists of diodes D1, D5, D9 that are operable in the normal condition. The first feedback path is connected between the emitter of the feedback transistor Q5 and the base of transistor Q3. The first feedback path is coupled to resistor R1 at the cathodes of diodes D1 and D5. A second feedback path consists of diodes D3 and D7 that are operable in the overdrive condition. The second feedback path is also connected between the emitter of the feedback transistor Q5 and the base of transistor Q3. In the overdrive condition, biasing for diodes D3 and D7 is provided by current sources I5 and I7. A second current source, I7, is needed to keep diode D7 biased on during the overdrive condition. Diode D7 provides additional collector-to-emitter voltage for transistor Q1 in the overdrive condition. Diode D9 is necessary to ensure that the second feedback path is off during the normal operating mode. The amplifier 20 of FIG. 9 is coupled with an identical amplifier (not shown) to form a differential amplifier in the manner described above regarding differential amplifier 10.

Figure 9A:
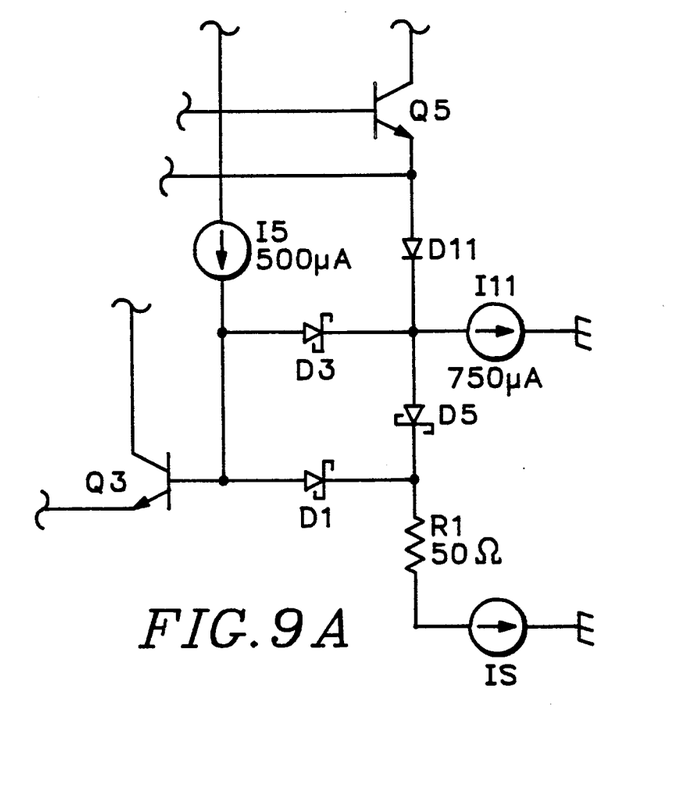

An alternative embodiment of the amplifier of FIG. 9 is shown in FIG. 9A. Only a portion of the schematic is shown, but in pertinent part, the amplifier includes an additional diode D11 and current source I11 and does not include diodes D7 and D9, or current source I7. Although the operation of the circuit is similar to that described above, it is important to note that diode D11 provides additional collector-to-base voltage for transistor Q1, but using one less diode. However, multiple series-connected diodes in place of diode D11 can be used if additional collector-to-base voltage is required. An additional feature is provided by the embodiment of FIG. 9A in that Schottky diodes can be used for any or all of diodes D1, D3, D5, and D11.

Figure 10:
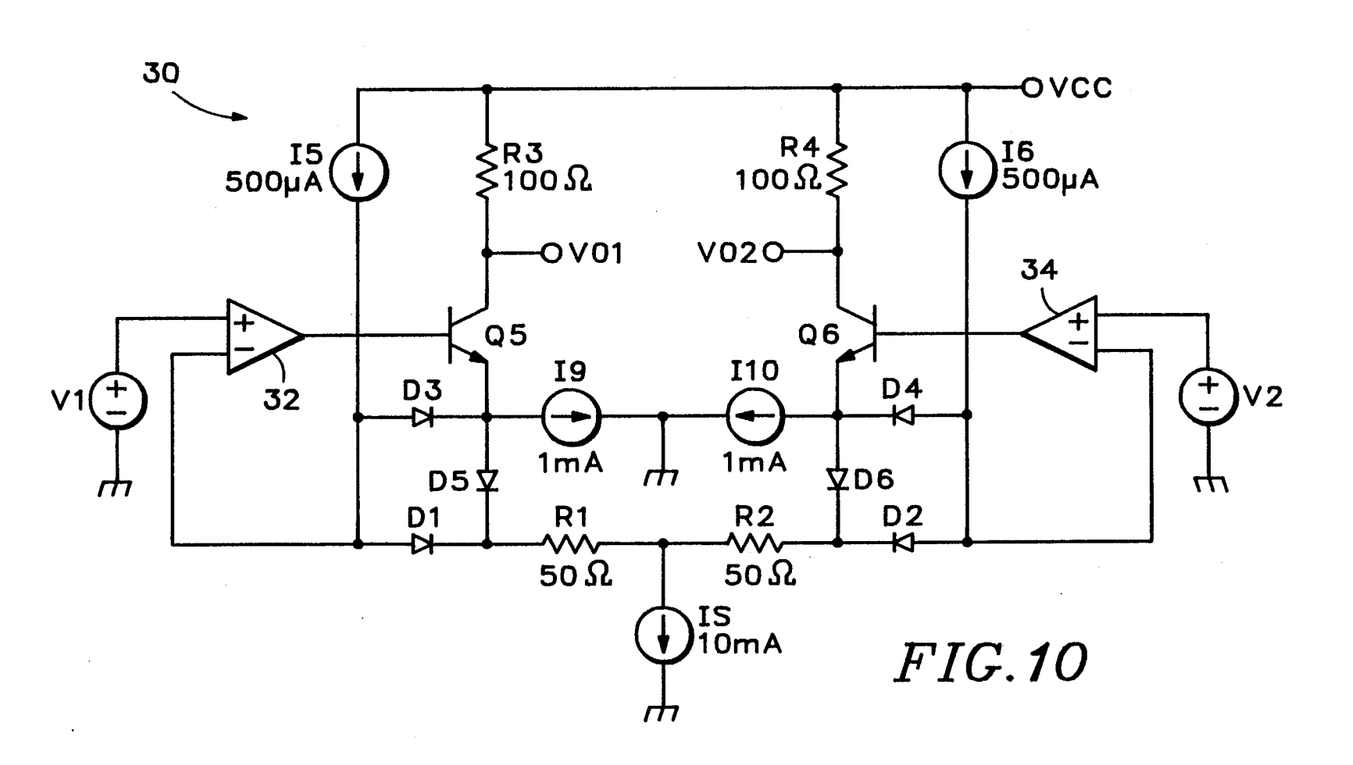

Another alternative embodiment of a differential amplifier 30 is shown in FIG. 10. Operational amplifiers 32 and 34 are substituted for the differential pairs of transistors Q1, Q2 and Q3, Q4 shown in FIG. 1. The positive input of operational amplifiers 32 and 34 are respectively coupled to single-ended input voltages V1 and V2. The outputs of operational amplifiers 32 and 34 are respectively connected to the base of transistors Q5 and Q6. The emitter of transistors Q5 and Q6 are respectively connected through first and second feedback paths to the negative inputs of operational amplifiers 32 and 34. The configuration and operation of differential amplifier is similar to differential amplifier 10 described above and shown in FIG. 1, with the exception that additional current sources I9 and I10 are needed to provide a current return for diodes D3 and D4, and to provide bias current for transistors Q5 and Q6 during the overdrive condition. Note that operational amplifiers 32 and 34 do not depend on current sources I5 and I6 for bias current.

A feature of differential amplifier 30 is that diodes D1-D6 can be either Schottky diodes or silicon diodes. In an operational amplifier, the voltage at the output is not generally restricted by the voltage at the positive and negative inputs. In addition, differential amplifier 30 is linear and accurate since the feedback of the operational amplifier forces the voltage at the negative input to be equal to the voltage at the positive input. Differential amplifier 30 can be fabricated as an integrated circuit or, if desired, out of discrete components such as commercially available transistors and operational amplifiers.

Figure 11:
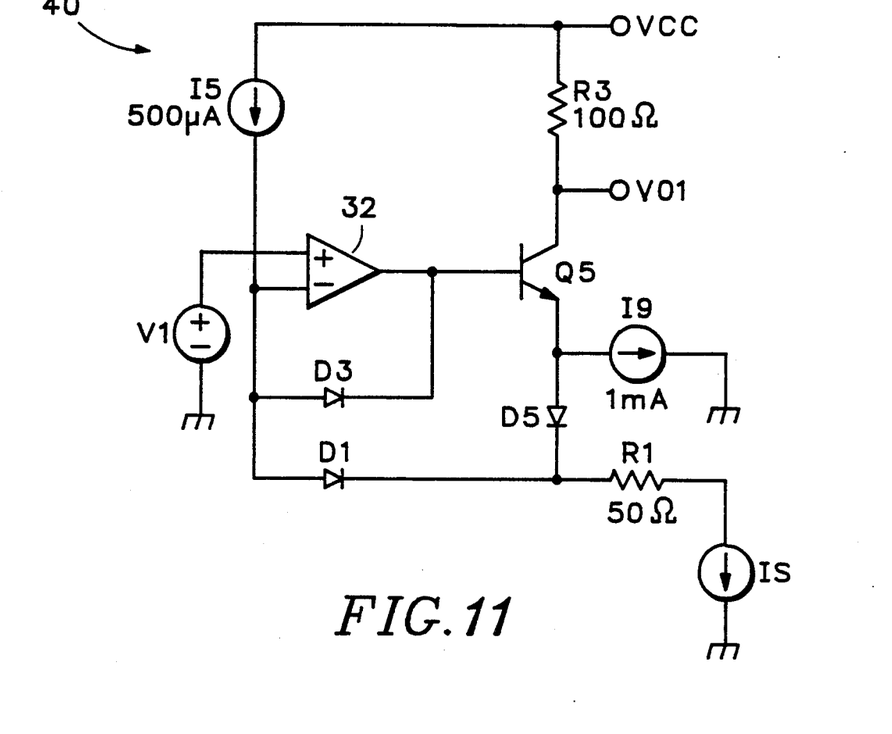

An alternative embodiment of amplifier 40 suitable for use in a differential amplifier is shown in FIG. 11. This embodiment is similar in configuration and operation to the amplifier shown in FIG. 10 with the exception that the second feedback path consisting of diode D3 is connected between the output of operational amplifier 32 and the negative input of operational amplifier 32. The amplifier 40 of FIG. 11 is coupled with an identical amplifier (not shown) to form a differential amplifier in the manner described above regarding differential amplifier 30.

Figure 12:
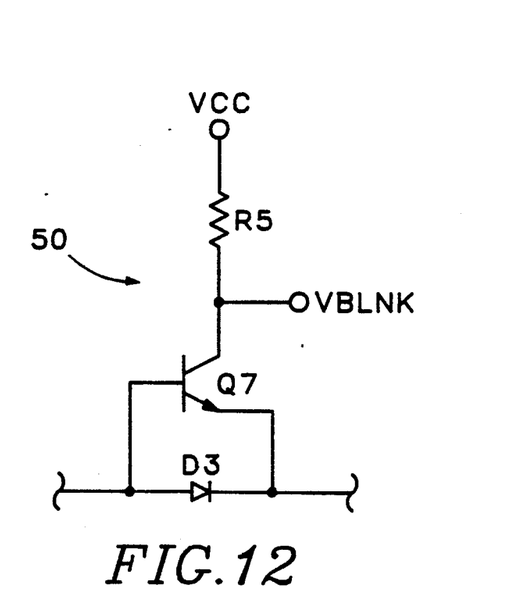
FIGS. 12 and 12A are schematic diagrams of circuits for indicating the presence of an overdrive condition that can be used in conjunction with the overdrive recovery circuit of the present invention.

In some applications of differential amplifiers 10-40 it may be desirable to include a circuit for indicating an overdrive condition. Such an overdrive indication circuit 50 is shown in FIG. 12. Overdrive indication circuit 50 is suitable for use with those embodiments of the present invention using silicon diodes in the second feedback path. Overdrive indication circuit 50 comprises a transistor Q7 coupled to the diode D3 in the second feedback path. As explained above, diode D3 is biased on in the overdrive condition, and therefore diode D3 and transistor Q7 act as a current mirror whereby the current flowing through diode D3 is mirrored in the collector of transistor Q7. A load resistor, R5, provides an active-low voltage signal designated VBLNK in response to the overdrive condition.

Figure 12A:
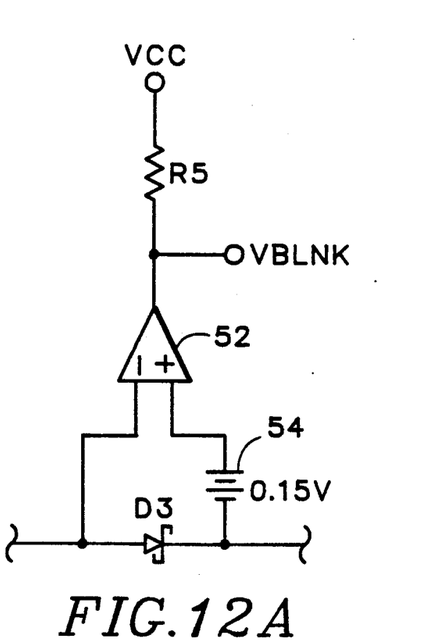

A more general embodiment of the overdrive indication circuit is shown in FIG. 12A that can operate with Schottky diodes. Transistor Q7 is replaced with a comparator 52 and an offset voltage source 54. The value of offset voltage source 54 is set to 0.15 volts, Or about one-half of a typical Schottky forward bias voltage. During normal operation, Schottky diode D3 is off. Therefore, because of the offset voltage, the output of comparator 52 is high. During the overdrive condition, Schottky diode D3 is on. Therefore, the forward bias voltage of the Schottky diode is greater than the offset voltage, and the output of comparator 52 is low. Thus, an active-low indication of an overdrive condition is provided as in the embodiment of FIG. 12.

While the invention has been particularly shown and described with reference to certain preferred embodiments, it is understood by those skilled in the art that various changes in form and detail can be made without departing from the spirit and scope of the invention.

We claim:

1. A differential amplifier having two identical halves, each half comprising:
   (a) an amplifier stage having a positive input coupled to a single-ended input voltage source, a negative input, a negative output and a positive output;
   (b) a single feedback transistor having a base connected to the positive output of the amplifier stage, and a collector for providing a single-ended current output;
   (c) a first feedback path consisting of first and second diodes operable in a normal condition connected between the emitter of the feedback transistor and the negative input, the first feedback path further including an output node disposed between the first and second diodes;
   (d) a second feedback path consisting of a third diode operable in an overdrive condition connected between the emitter of the feedback transistor and the negative input;
   (e) means for biasing the third diode during the overdrive condition; and
   (f) means for coupling the halves together at the output node in the first feedback path of each half.

2. A differential amplifier as in claim 1 in which the amplifier stage comprises:
   (a) a differential pair of transistors having first and second base nodes respectively forming the positive and negative inputs, and first and second collector nodes respectively forming the negative and positive outputs; and
   (b) means for biasing the differential par of transistors.

3. A differential amplifier as in claim 2 in which the means for biasing the third diode during the overdrive condition comprises a third current source coupled to the second base node.

4. A differential amplifier as in claim 2 in which at least one of the first, second, and third diodes comprise a Schottky diode.

5. A differential amplifier as in claim 1 in which the amplifier stage comprises an operational amplifier having a positive input, a negative input, and an output respectively to the positive input, the negative positive input, and the output of the amplifier stage.

6. A differential amplifier as in claim 5 in which the means for biasing the third diode during the overdrive condition comprises a first current source coupled to the negative input of the operational amplifier and a second current source coupled to the emitter of the feedback transistor.

7. A differential amplifier as in claim 1 including means for indicating an overdrive condition coupled to the second feedback path.

8. A differential amplifier having two identical halves, each half comprising:
   (a) a differential pair of transistors having a first base node coupled to an input voltage, a second base node, and first and second collector nodes;
   (b) means for biasing the differential pair of transistors;
   (c) a single feedback transistor having a base connected to the second collector node, an emitter connected to the first collector node, and a collector for providing a single-ended current output;
   (d) a first feedback path consisting of first, second, and third diodes operable in a normal condition connected between the emitter of the feedback transistor and the second base node, the first feedback path further including an output node disposed between the first and second diodes;
   (e) a second feedback path consisting of fourth and fifth diodes operable in an overdrive condition connected between the emitter of the feedback transistor and the second base node;
   (f) means for biasing the fourth and fifth diodes during the overdrive condition; and
   (g) means for coupling the halves together at the output node in the first feedback path of each half.

9. A differential amplifier as in claim 8 in which the means for biasing the fourth and fifth diodes during the overdrive condition comprises a first current source coupled to a junction of the fourth and fifth diodes and a second current source coupled to the second base node.

10. A differential amplifier as in claim 8 in which at least one of the first, second, third, fourth, and fifth diodes comprise a silicon diode.

11. A differential amplifier as in claim 8 including means for indicating an overdrive condition coupled to the second feedback path.

12. A differential amplifier having two identical halves, each half comprising:
   (a) an operational amplifier having a first input coupled to an input voltage, a second input, and an output;
   (b) a single feedback transistor having a base connected to the output of the operational amplifier, an emitter, and a collector for providing a single-ended current output;
   (c) a first feedback path consisting of first and second diodes operable in a normal condition connected between the emitter of the feedback transistor and the second input of the operational amplifier, the first feedback path further including an output node disposed between the first and second diodes;
   (d) a second feedback path consisting of a third diode operable in an overdrive condition connected between the output and the second input of the operational amplifier;
   (e) means for biasing the third diode during the overdrive condition; and
   (f) means for coupling the halves together at the output node in the first feedback path of each half.

13. A differential amplifier as in claim 12 in which the means for biasing the third diode during the overdrive condition comprises a first current source coupled to the second input of the operational amplifier and a second current source coupled to the emitter of the feedback transistor.

14. A differential amplifier as in claim 12 including means for indicating an overdrive condition coupled to the second feedback path.

15. A method of providing overdrive recovery in an amplifier suitable for use as on half of a differential amplifier, the amplifier being of the type having first and second complementary voltage inputs with a single-ended voltage source coupled to the first voltage input, first and second complementary voltage outputs, and a single feedback transistor coupled to the second voltage output for providing a current output, for driving a load impedance, and for providing a closed-loop gain between the current output and the second voltage input, the method comprising:
   (a) providing a first feedback path consisting of first and second diodes operable in a normal condition connected between an emitter of the feedback transistor and the second voltage input, a junction of the first and second diodes being coupled to the load impedance;
   (b) providing a second feedback path consisting of a third diode operable in an overdrive condition connected between the emitter of the feedback transistor and the second voltage input, such that the differential amplifier and the feedback transistor remain operational and are electrically isolated from the load impedance; and
   (c) compensating for losses due to feedback transistor beta by coupling the emitter of the feedback transistor to the first voltage output.

* * * * *